US012341030B2

(12) United States Patent
Kim et al.

(10) Patent No.: US 12,341,030 B2
(45) Date of Patent: Jun. 24, 2025

(54) SUPPORT UNIT AND SUBSTRATE TREATING APPARATUS

(71) Applicant: SEMES CO., LTD., Cheonan-si (KR)

(72) Inventors: Kyung Man Kim, Seongnam-si (KR); Jeong Woo Han, Gunpo-si (KR); Ji-hwan Lee, Incheon (KR); Wan Jae Park, Hwaseong-si (KR); Yoon Jong Ju, Cheonan-si (KR); Seong Hak Bae, Changwon-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 251 days.

(21) Appl. No.: 17/704,218

(22) Filed: Mar. 25, 2022

(65) Prior Publication Data

US 2023/0307266 A1 Sep. 28, 2023

(51) Int. Cl.
*H01L 21/67* (2006.01)
*H01L 21/683* (2006.01)

(52) U.S. Cl.
CPC .. *H01L 21/67103* (2013.01); *H01L 21/67248* (2013.01); *H01L 21/6833* (2013.01)

(58) Field of Classification Search
CPC .................................................. C23C 16/4586
See application file for complete search history.

(56) References Cited

U.S. PATENT DOCUMENTS

| | | | | | |
|---|---|---|---|---|---|
| 5,914,568 | A | * | 6/1999 | Nonaka | H01L 21/6831 315/111.41 |
| 2008/0017104 | A1 | * | 1/2008 | Matyushkin | H01L 21/6831 118/58 |
| 2011/0076432 | A1 | * | 3/2011 | Sakaguchi | B65D 1/02 53/440 |
| 2011/0292562 | A1 | * | 12/2011 | Lee | H01L 21/6831 361/234 |

FOREIGN PATENT DOCUMENTS

| | | |
|---|---|---|
| JP | H06-333810 A | 12/1994 |
| KR | 2015-0062907 A | 6/2015 |
| KR | 101729125 B1 | 4/2017 |
| KR | 102000080 B1 | 7/2019 |
| KR | 2020-0052568 A | 5/2020 |

OTHER PUBLICATIONS

English translation JP H06333810, 12-2994, Hara (Year: 1994).*

* cited by examiner

*Primary Examiner* — Keath T Chen
(74) *Attorney, Agent, or Firm* — Harness, Dickey & Pierce, P.L.C.

(57) ABSTRACT

The present invention provides a support unit, including: a support plate on which a substrate is placed, and which includes an electrostatic electrode providing electrostatic force to the substrate; a heater provided inside the support plate and configured to heat the substrate; an insulating plate provided under the support plate as an insulating substance; and a bimetal member disposed inside the support plate and configured to compensate for bending of the support plate (Continued)

due to heat, in which the bimetal member includes: a pin provided to be in contactable with a bottom surface of the substrate that is placed on the support plate; a first member configured to support the pin; and a second member provided to surround the first member, and the pin is provided to move up or move down according to a difference in the amount of thermal deformation between the first member and the second member.

17 Claims, 6 Drawing Sheets

SUPPORT UNIT AND SUBSTRATE TREATING APPARATUS

TECHNICAL FIELD

The present invention relates to a support unit supporting a substrate, such as a wafer, and a substrate treating apparatus including the same.

BACKGROUND ART

In general, in order to treat a surface of a semiconductor wafer, a flat panel display substrate, and the like, the substrate is provided into a chamber and the substrate is supported by a chuck to be treated. A heater is provided inside the chuck in order to treat the substrate at a process temperature, and there is a problem in that the chuck is bent due to the difference in the amount of thermal deformation between the materials forming the chuck.

In one example, there is a problem in that the chuck used in an etching process is bent by the heater provided inside the chuck. The etching process is a process of applying high-frequency power to the vacuum chamber to flow the gas supplied into the chamber in a plasma state, and etching and removing a thin film by high-energy electrons or radicals formed at this time. An electrostatic chuck is provided within the vacuum chamber in order to support the substrate. The electrostatic chuck is provided with a dielectric plate including an electrostatic electrode and a heater therein and provided as a dielectric substance, and an insulating plate placed under the dielectric plate and provided as an insulating substance to insulate the dielectric plate. When the chuck is heated by the heater, due to the difference in the amount of thermal deformation between the dielectric plate and the insulating plate, the center of the chuck is deformed into a shape that bulges up. In order to compensate for this, the shape of the chuck is designed or the chuck is additionally processed in consideration of the difference in the amount of thermal deformation between the dielectric plate and the insulating plate. However, there is a problem in that time and costs are consumed for designing and processing the chuck.

SUMMARY OF THE INVENTION

The present invention has been made in an effort to provide a support unit which is capable of compensating for thermal deformation between members having different thermal deformation rates by using a bimetal member, and a substrate treating apparatus.

The problem to be solved by the present invention is not limited to the above-mentioned problems. The problems not mentioned will be clearly understood by those skilled in the art from the descriptions below.

The present invention provides a support unit. In an example, the support unit includes: a support plate on which a substrate is placed, and which includes an electrostatic electrode providing electrostatic force to the substrate; a heater provided inside the support plate and configured to heat the substrate; an insulating plate provided under the support plate as an insulating substance; and a bimetal member disposed inside the support plate and configured to compensate for bending of the support plate due to heat, in which the bimetal member includes: a pin provided to be in contactable with a bottom surface of the substrate that is placed on the support plate; a first member configured to support the pin; and a second member provided to surround the first member, and the pin is provided to move up or move down according to a difference in the amount of thermal deformation between the first member and the second member.

In the example, a movement direction of the pin according to the difference in the amount of thermal deformation between the first member and the second member may be a direction opposite to a direction in which the support plate is bent according to a difference in the amount of thermal deformation between the support plate and the insulating plate in a region in which the bimetal member is provided.

In the example, a thermal deformation rate of the first member may be different from a thermal deformation rate of the second member.

In the example, the thermal deformation rate of the first member may be larger than the thermal deformation rate of the second member.

In the example, a volume of each of the first member and the second member may be determined according to a difference in the amount of thermal deformation between the support plate and the insulating plate.

In the example, the difference in the amount of thermal deformation between the first member and the second member may be determined according to a difference in the amount of thermal deformation between the support plate and the insulating plate.

In the example, a plurality of bimetal members may be provided, and each of the bimetal members may be disposed in a hollow hole formed inside the support plate.

In the example, the support plate may include: a dielectric plate on which the substrate is placed, and which includes the electrostatic electrode therein and is provided as a dielectric substance; and a lower plate disposed under the dielectric plate and provided with a cooling flow path therein, and the bimetal member is disposed in the hollow hole formed inside the dielectric plate.

Further, the present invention provides a support unit, including: a first plate on which a substrate is placed; a heater provided inside the first plate to heat the substrate; a second plate provided under the first plate in a different material from a material of the first plate; and a bimetal member disposed inside the first plate and configured to compensate for bending of the first plate, in which the bimetal member may include: a pin provided to be in contactable with a bottom surface of the substrate that is placed on the support plate; a first member configured to support the pin; and a second member provided to surround the first member, and the pin is provided to move up or move down according to a difference in the amount of thermal deformation between the first member and the second member.

In the example, a movement direction of the pin according to the difference in the amount of thermal deformation between the first member and the second member may be a direction opposite to a direction in which the first plate is bent according to a difference in the amount of thermal deformation between the first plate and the second plate in a region in which the bimetal member is provided.

In the example, a thermal deformation rate of the first member may be different from a thermal deformation rate of the second member.

In the example, the thermal deformation rate of the first member may be larger than the thermal deformation rate of the second member.

In the example, a volume of each of the first member and the second member may be determined according to a difference in the amount of thermal deformation between the first plate and the second plate.

In the example, the difference in the amount of thermal deformation between the first member and the second member may be determined according to a difference in the amount of thermal deformation between the first plate and the second plate.

In the example, the amount of thermal deformation of the plate may be larger than the amount of thermal deformation of the second plate.

In the example, the first plate may include a dielectric substance, and the second plate may include an insulating substance.

Further, the present invention provides a substrate treating apparatus, including: a dielectric plate on which a substrate is placed, and which includes an electrostatic electrode therein and is provided as a dielectric substance; a lower plate disposed under the dielectric plate and provided with a cooling flow path therein; a heater provided inside the dielectric plate to heat the substrate; an insulating plate provided under the lower plate as an insulating substance; and a bimetal member disposed inside the dielectric plate and configured to compensate for bending of the dielectric plate due to heat, in which the bimetal member includes: a pin provided to be contactable with a bottom surface of the substrate that is placed on the dielectric plate; a first member configured to support the pin; and a second member provided to surround the first member, and the pin is provided to move up or move down according to a difference in the amount of thermal deformation between the first member and the second member.

In the example, a movement direction of the pin according to the difference in the amount of thermal deformation between the first member and the second member may be a direction opposite to a direction in which the dielectric plate is bent according to a difference in the amount of thermal deformation between the dielectric plate, the lower plate, and the insulating plate in a region in which the bimetal member is provided.

In the example, the thermal deformation rate of the first member may be larger than the thermal deformation rate of the second member.

In the example, the difference in the amount of thermal deformation between the first member and the second member may be determined according to a difference in the amount of thermal deformation between the dielectric plate, the lower plate, and the insulating plate.

According to the exemplary embodiment of the present invention, it is possible to compensate for thermal deformation between members having different thermal deformation rates by using the bimetal member.

The effect of the present invention is not limited to the foregoing effects. Those skilled in the art may clearly understand non-mentioned effects from the present specification and the accompanying drawings.

DETAILED DESCRIPTION

Advantages and characteristics, and a method for achieving them will be clear when exemplary embodiments described in detail with reference to the accompanying drawings are referred to. However, the present disclosure is not limited to exemplary embodiments disclosed herein but will be implemented in various forms, and the exemplary embodiments are provided so that the present disclosure is completely disclosed, and a person of ordinary skilled in the art can fully understand the scope of the present disclosure, and the present disclosure will be defined only by the scope of the appended claims.

Even if not defined, all terms (including technical or scientific terms) used herein have the same meaning as commonly accepted by common skill in the prior art to which this invention belongs. Terms defined by the general dictionaries may be interpreted as having the same meaning as in the related art and/or in the text of the present application, and the terms will not be conceptualized or interpreted overly formal even if the term is not a clearly defined expression here. The terms used in the present specification is for the purpose of describing exemplary embodiments, and do not intend to limit the present invention.

In the present specification, a singular form includes a plural form as well, unless otherwise mentioned. A term "include" and/or various conjugations of this verb do not exclude the existence or an addition of one or more other compositions, components, constituent elements, steps, operations, and/or devices, in addition to the mentioned composition, component, constituent element, step, operation, and/or device. Further, "is provided", "have", and the like should be interpreted in the same way.

Figure 1:
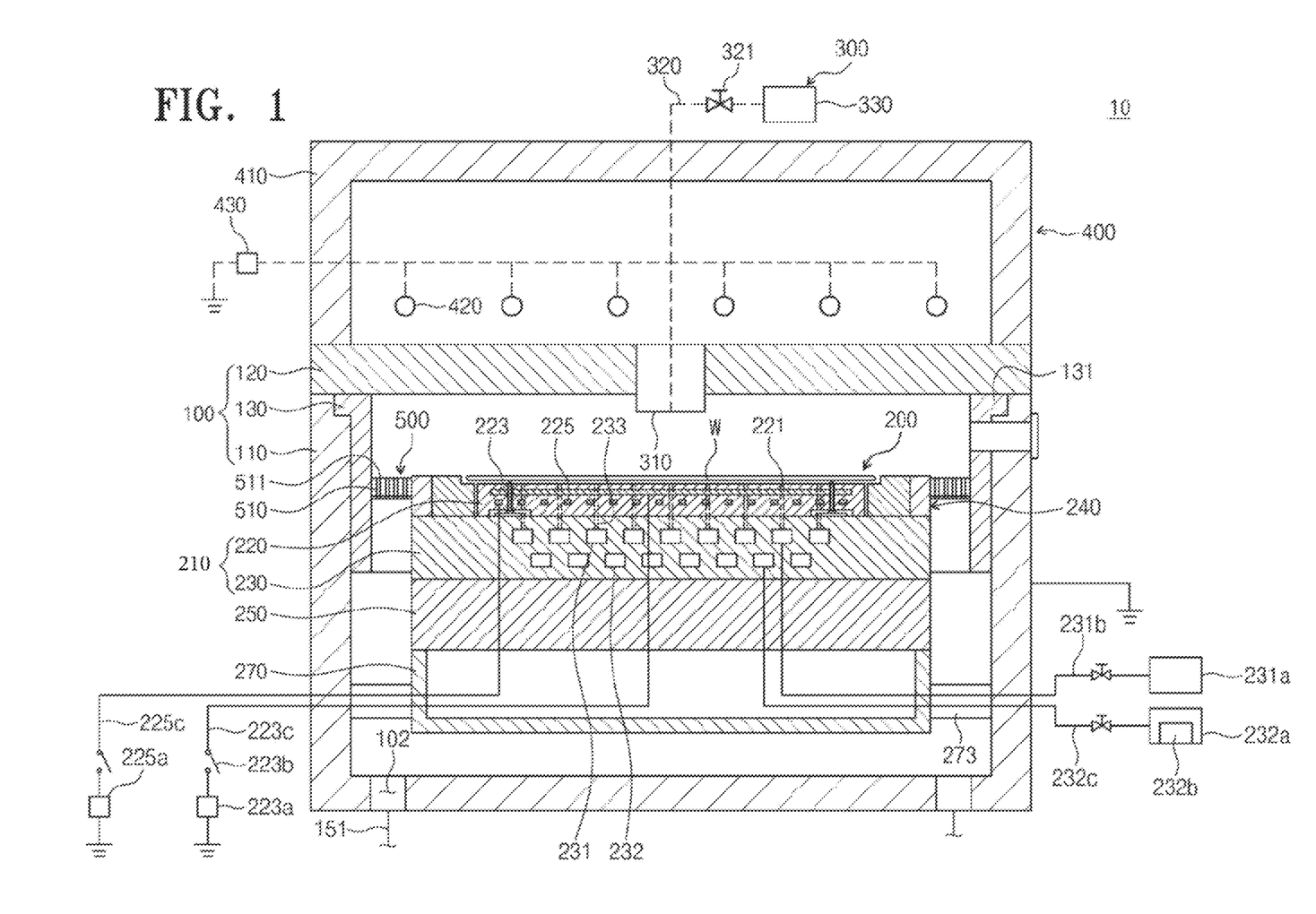
FIG. 1 is a diagram illustrating a substrate treating apparatus according to an exemplary embodiment of the present invention.
Figure 2:
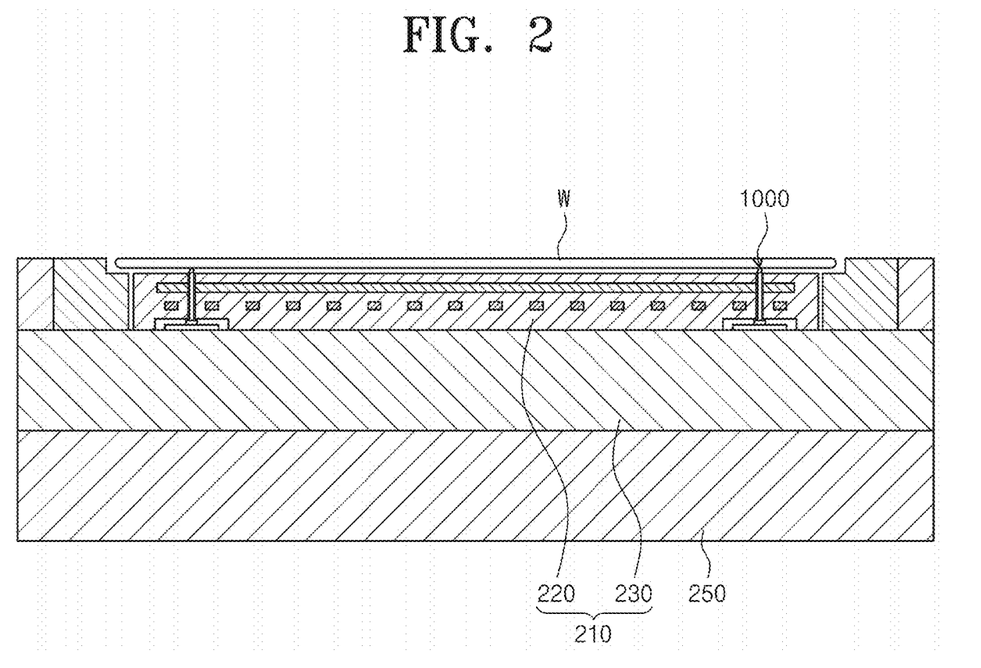
FIG. 2 is a schematic sectional view of a support unit according to the exemplary embodiment of the present invention.

FIG. 1 is a diagram illustrating a substrate treating apparatus according to an exemplary embodiment of the present invention, and FIG. 2 is a schematic sectional view of a support unit according to the exemplary embodiment of the present invention. FIG. 1 illustrates a substrate treating apparatus by an Inductively Coupled Plasma (ICP) processing method, but the present invention is not limited thereto, and the present invention may also be applied to a substrate treating apparatus by a Capacitively Coupled Plasma (CCP) processing method. Optionally, in a chuck for supporting a substrate, if the chuck is made of a material that generates thermal deformation, the chuck is applicable.

A substrate treating apparatus 10 treats a substrate W by using plasma. For example, the substrate treating apparatus 10 may perform an etching process on the substrate W. Referring to FIGS. 1 and 2, the substrate treating apparatus 10 includes a chamber 100, a support unit 200, a gas supply unit 300, a plasma source 400, and an exhaust unit 500. The chamber 100 has a treatment space in which a substrate is treated. The chamber 100 includes a housing 110, a cover 120, and a liner 130.

The housing 110 has a space with an opened top surface therein. An inner space of the housing 110 is provided as a treatment space in which a substrate treatment process is performed. The housing 110 is made of a metal material. The housing 110 may be made of an aluminum material. The housing 110 may be grounded. An exhaust hole 102 is formed in a bottom surface of the housing 110. The exhaust hole 102 is connected with an exhaust line 151. Reaction by-products generated during the process and gas remaining in the inner space of the housing may be discharged to the outside through the exhaust line 151. By the exhaust process, the inside of the housing 110 is decompressed to a predetermined pressure.

The cover 120 covers the opened top surface of the housing 110. The cover 120 is provided in a plate shape, and seals the inner space of the housing 110. The cover 120 may include a dielectric substance window.

The liner 130 is provided inside the housing 110. The liner 130 has an inner space with an open upper surface and an open lower surface. The liner 130 may be provided in a cylindrical shape. The liner 130 may have a radius corresponding to an inner surface of the housing 110. The liner 130 is provided along the inner surface of the housing 110. A support ring 131 is formed at an upper end of the liner 130. The support ring 131 is provided in a ring-shaped plate, and protrudes to the outside of the liner 130 along a circumference of the liner 130. The support ring 131 is placed on the upper end of the housing 110, and supports the liner 130. The liner 130 may be made of the same material as that of the housing 110. The liner 130 may be made of an aluminum material. The liner 130 protects the inner surface of the housing 110. An arc discharge may be generated inside the chamber 100 while the process gas is excited. The arc discharge damages peripheral devices. The liner 130 protects the inner surface of the housing 110 to prevent the inner surface of the housing 110 from being damaged due to the arc discharge. Further, the liner 130 prevents the reaction by-products generated during the substrate treating process from being deposited on an inner wall of the housing 110. The liner 130 has a lower cost than the housing 110, and is easy to replace. Accordingly, when the liner 130 is damaged due to the arc discharge, an operator is capable of replacing the damaged liner with a new liner 130.

The support unit 200 supports a substrate in the treatment space inside the chamber 100. For example, the support unit 200 is disposed inside the chamber housing 110. The support unit 200 supports the substrate W. In the example, the support unit 200 may be provided as an electrostatic chuck which adsorbs the substrate W by using electrostatic force.

In one example, the support unit 200 may be provided to be spaced apart from the bottom surface of the chamber housing 110 to the top inside the chamber 100. In one example, the support unit 200 includes a support plate 210, an insulating plate 250, a bimetal member 1000, a focus ring 240, and a lower cover 270.

The support plate 210 includes a dielectric plate 220 and a lower plate 230.

The dielectric plate 220 is located at an upper end of the support unit 200. In one example, the dielectric plate 220 is provided as a disk-shaped dielectric substance. The substrate W is placed on an upper surface of the dielectric plate 220. In one example, the upper surface of the dielectric plate 220 has a radius smaller than that of the substrate W. In one example, in the dielectric plate 220, a first supply flow path 221 used as a passage through which heat transfer gas is supplied to the bottom surface of the substrate W is formed. In one example, an electrostatic electrode 223 and a heater 225 are embedded in the dielectric plate 220. The electrostatic electrode 223 is located above the heater 225. The electrostatic electrode 223 is electrically connected with a first lower power source 223a. Electrostatic force is applied between the electrostatic electrode 223 and the substrate W by a current applied to the electrostatic electrode 223, and the substrate W is adsorbed to the dielectric plate 220 by the electrostatic force. During the dechucking of the substrate, a voltage applied from the first lower power source 223a to the electrostatic electrode 223 is controlled.

The heater 225 is electrically connected with a second lower power source 225a. The heater 225 generates heat while resisting to a current applied to the second lower power source 225a. The generated heat is transferred to the substrate W through the dielectric plate 220. By the heat generated in the heater 225, the substrate W is maintained at a predetermined temperature.

The lower plate 230 is located under the dielectric plate 220. In one example, the bottom surface of the dielectric plate 220 and the upper surface of the lower plate 230 may be bonded by an adhesive (not illustrated). In one example, in the lower plate 230, a first circulation flow path 231, a second circulation flow path 232, and a second supply flow path 233 are formed. The first circulation flow path 231 is provided as a passage through which the heat transfer gas is circulated. The second circulation flow path 232 is provided as a passage through which a cooling fluid is circulated. The second supply flow path 233 connects the first circulation flow path 231 and the first supply flow path 221. The first circulation flow path 231 is provided as a passage through which the heat transfer gas is circulated. The first circulation flow path 231 may be formed in a spiral shape inside the lower plate 230. Otherwise, the first circulation flow path 231 may be arranged such that ring-shaped flow paths having different radii have the same center. The respective first circulation flow paths 231 may communicate with each other. The first circulation flow paths 231 are formed at the same height.

The first circulation flow path 231 is connected with a heat transfer medium storage unit 231a through a heat transfer medium supply line 231b. A heat transfer medium is stored in the heat transfer medium storage unit 231a. The heat transfer medium includes inert gas. According to the exemplary embodiment, the heat transfer medium includes helium (He) gas. Helium gas is supplied to the first circulation flow path 231 through the supply line 231b, and sequentially passes through the second supply flow path 233 and the first supply flow path 221 and is supplied to the bottom surface of the substrate W. Helium gas serves as a medium helping heat exchange between the substrate W and the electrostatic chuck. Accordingly, the substrate W has a uniform temperature as a whole.

The second circulation flow path 232 is connected with a cooling fluid storage unit 232a through the cooling fluid supply line 232c. The cooling fluid is stored in the cooling fluid storage unit 232a. A cooling device 232b may be provided inside the cooling fluid storage unit 232a. The cooling device 232b cools the cooling fluid to a predetermined temperature. Contrary to this, the cooling device 232b may be installed on the cooling fluid supply line 232c. The cooling fluid supplied to the second circulation flow path 232 through the cooling fluid supply line 232c cools the lower plate 230 while circulating along the second circulation flow path 232. The lower plate 230 cools the dielectric plate 220 and the substrate W together while being cooled to maintain the substrate W at a predetermined temperature.

The focus ring 240 is disposed in an edge region of the electrostatic chuck. The focus ring 240 has a ring shape, and is disposed along the circumference of the dielectric plate 220 to support the edge region of the substrate W.

The insulating plate 250 is located under the lower plate 230. The insulating plate 250 is made of an insulating material, and electrically insulates the lower plate 230 and the lower cover 270.

The bimetal member 1000 is disposed inside the support plate 210, and compensates for bending of the support plate 210 by heat. The bimetal member 1000 will be described in detail with reference to FIGS. 3 to 8 below.

The lower cover 270 is located at a lower end of the support unit 200. In one example, the lower cover 270 is located while being spaced apart from the bottom surface of the housing 110 to the top. The lower cover 270 has a space with an open upper surface therein. An upper surface of the lower cover 270 is covered by the insulating plate 250. Therefore, the outer radius of the cross-section of the lower cover 270 may be provided to have the same length as the outer radius of the insulating plate 250. In the inner space of the lower cover 270, a lift pin module (not illustrated) and the like for moving the transferred substrate W from an external transfer member to the electrostatic chuck may be located.

The lower cover 270 includes a connection member 273. The connection member 273 connects an external surface of the lower cover 270 and the inner wall of the housing 110. A plurality of the connection members 273 may be provided on the external surface of the housing 270 at a predetermined interval. The connection member 273 supports the support unit 200 inside the chamber 100. Further, the connection member 273 is connected with the inner wall of the housing 110 to make the lower cover 270 be electrically grounded. A first power source line 223c connected with the first lower power source 223a, a second power source line 225c connected with the second lower power source 225a, a heat transfer medium supply line 231b connected with the heat transfer medium storage unit 231a, the cooling fluid supply line 232c connected with the cooling fluid storage unit 232a, and the like are extended into the lower cover 270 through an inner space of the connection member 273.

The gas supply unit 300 supplies process gas to the treatment space inside the chamber 100. The gas supply unit 300 includes a gas supply nozzle 310, a gas supply line 320, and a gas storage unit 330. The gas supply nozzle 310 is installed in the center of the cover 120. An injection port is formed in the bottom surface of the gas supply nozzle 310. The injection port is located under the cover 120, and supplies process gas into the chamber 100. The gas supply line 320 connects the gas supply nozzle 310 and the gas storage unit 330. The gas supply line 320 supplies the process gas stored in the gas storage unit 330 to the gas supply nozzle 310. A valve 321 is installed in the gas supply line 320. The valve 321 opens/closes the gas supply line 320, and adjusts a flow rate of the process gas supplied through the gas supply line 320.

The plasma source 400 excites the process gas supplied to the treatment space in a plasma state. As the plasma source 400, an ICP source may be used. The plasma source 400 includes an antenna chamber 410, an antenna 420, and a plasma power source 430. The antenna chamber 410 is provided in a cylindrical shape with an open lower portion. The antenna chamber 410 has a space therein. The antenna chamber 410 is provided to have a diameter corresponding to the chamber 10. A lower end of the antenna chamber 410 is provided to be detachable from the cover 120. The antenna 420 is disposed inside the antenna chamber 410. The antenna 420 is provided as a spiral coil wound a plurality of times, and is connected with the plasma power source 430. The antenna 420 receives power from the plasma power source 430. The plasma power source 430 may be located outside the chamber 100. The antenna 420 to which power is applied may form an electromagnetic field in the treatment space of the chamber 100. The process gas is excited in the plasma state by the electromagnetic field.

The exhaust unit 500 is located between the inner wall of the housing 110 and the support unit 200. The exhaust unit 500 includes an exhaust plate 510 in which through holes 511 are formed. The exhaust plate 510 is provided in an annular ring-shape. The plurality of through-holes 511 is formed in the exhaust plate 510. The process gas provided into the housing 110 passes through the through-holes 511 of the exhaust plate 510 and is exhausted to the exhaust hole 102. A flow of the process gas may be controlled according to the shape of the exhaust plate 510 and the shape of the through-holes 511.

Hereinafter, the bimetal member 1000 of the present invention will be described in detail with reference to FIGS. 3 to 8.

Figure 3:
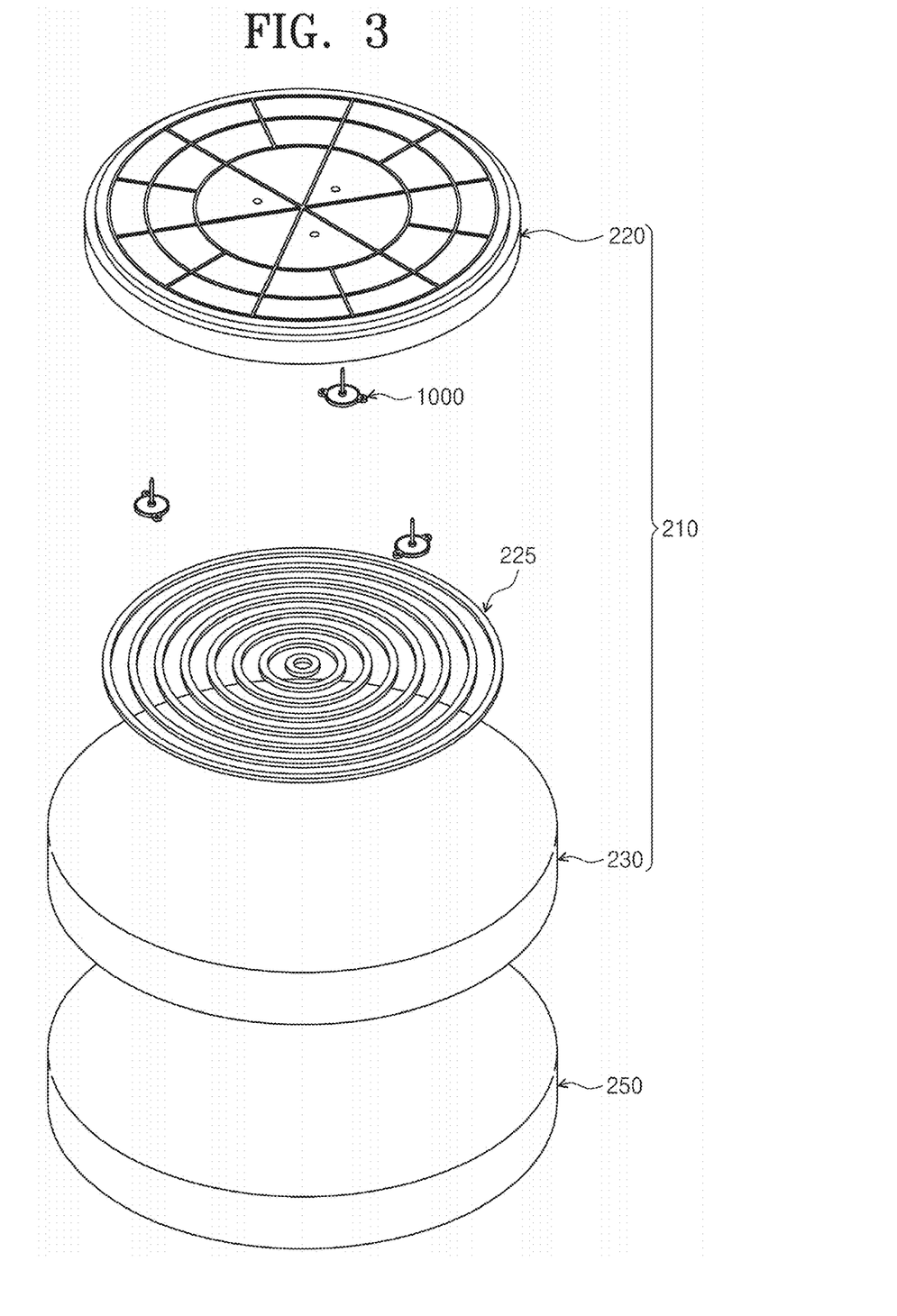
FIG. 3 is an exploded perspective view schematically illustrating the support unit according to the exemplary embodiment of the present invention.
Figure 4:
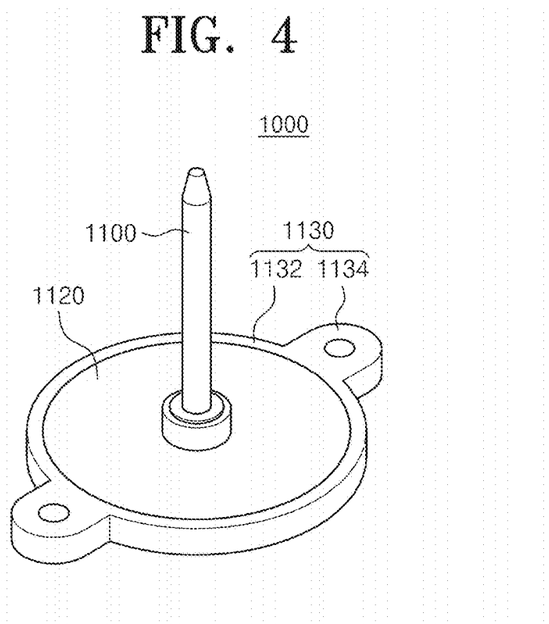
FIG. 4 is a perspective view illustrating a bimetal member according to the exemplary embodiment of the present invention.

FIG. 3 is an exploded perspective view schematically illustrating the support unit 200 according to the exemplary embodiment of the present invention, and FIG. 4 is a perspective view illustrating the bimetal member 1000 according to the exemplary embodiment of the present invention. Referring to FIGS. 2 and 3, in one example, the bimetal member 1000 is provided inside the support plate 210. For example, the bimetal member 1000 is provided in a hollow hole formed in the dielectric plate 220. In one example, the bimetal member 1000 may be provided to be inserted into the hollow hole formed in the dielectric plate 220 to be fastened to the dielectric plate 220. In one example, a plurality of bimetal members 1000 is provided. For example, the plurality of bimetal members 1000 may be disposed at the same distance in the radial direction from the center of the dielectric plate 220 at the same interval. In one example, the bimetal member 1000 may be disposed to be close to the edge region of the dielectric plate 220.

Referring to FIG. 4, the bimetal member 1000 includes a pin 1100, a first member 1120, and a second member 1130.

The pin 1100 is provided at a location that is in contact with the bottom surface of the substrate placed on the dielectric plate 220. In one example, the pin 1100 is made of a material having low thermal conductivity. In one example, the pin 1100 may be made of a resin, such as Teflon. Accordingly, thermal damage to the substrate W may be minimized.

The first member 1120 supports the pin 1100. In one example, the first member 1120 may be provided in a circular shape when viewed from above. In one example, the pin 1100 is provided at the center of the first member 1120. In one example, the pin 1100 may be provided to be coupled with an upper surface of the first member 1120. The second member 1130 is provided to surround the first member 1120. In one example, the second member 1130 has a body 1232 provided in a ring shape surrounding the first member 1120 and a support unit 1134 extending from the body 1232. The support unit 1134 helps the second member 1130 to be seated in the support plate 210.

In one example, the pin 1100 is provided to move up or move down along a difference in the amount of thermal deformation between the first member 1120 and the second member 1130. The first member 1120 and the second member 1130 are made of materials having different thermal deformation rates. In one example, the thermal deformation rate of the first member 1120 is provided to be higher than the thermal deformation rate of the second member 1130. Accordingly, at a high temperature, the second member 1130 has less deformation than the first member 1120.

In one example, a movement direction of the pin 1100 according to the difference in the amount of thermal deformation between the first member 1120 and the second member 1130 is provided in a direction opposite to a direction in which the support plate 210 is bent according to a difference in the amount of thermal deformation between the support plate 210 and the insulating plate 250 in the region in which the bimetal member 1000 is provided. For example, each of the dielectric plate 220, the lower plate 230, and the insulating plate 250 is provided with a different material. Accordingly, the thermal deformation rates of the dielectric plate 220, the lower plate 230, and the insulating plate 250 are different. Accordingly, when the support unit 200 is heated, the support unit 200 is bent due to the difference in the amount of thermal deformation between the dielectric plate 220, the lower plate 230, and the insulating plate 250. For example, when the support unit 200 is heated, the shape of the support unit 200 is deformed so that the center region of the support unit 200 rises convexly and the edge region of the support unit 200 sags downward compared to the center region of the support unit 200. Therefore, the substrate supported by the support unit 200 cannot be seated flat. In order to solve the problem, the bimetal member 1000 of the present invention is provided to the edge region of the support unit 200 to compensate for thermal deformation of the support unit 200.

Figure 5:
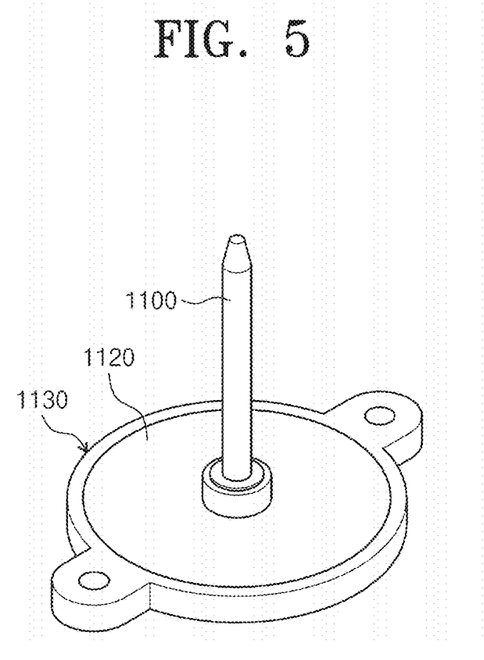
FIG. 5 is a perspective view illustrating the states before the bimetal member is deformed by heat according to the exemplary embodiment of the present invention.
Figure 6:
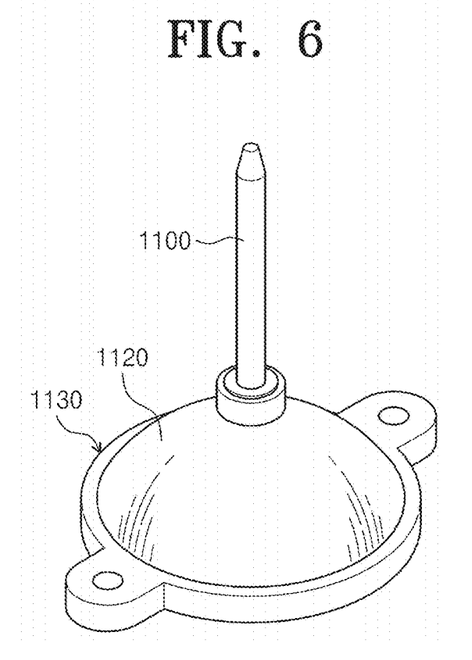
FIG. 6 is a perspective view illustrating the states after the bimetal member is deformed by heat according to the exemplary embodiment of the present invention.

FIG. 5 and FIG. 6 are a perspective view illustrating the states before and after the bimetal member 1000 is deformed by heat according to the exemplary embodiment of the present invention. FIG. 5 illustrates a state before the bimetal member 1000 is deformed by heat, and FIG. 6 illustrates a state after the bimetal member 1000 is deformed by heat. Referring to FIG. 5, before the bimetal member 1000 is deformed by heat, the first member 1120 and the second member 1130 are placed in a flat state. Thereafter, when heat is applied to the bimetal member 1000 by the heater and the like provided inside the support plate 210, the first member 1120 moves up and thus the pin 1100 moves up as illustrated in FIG. 6. At a high temperature, the second member 1130 prevents the first member 120 from being deformed in an X-direction. Therefore, the first member 1120 is deformed in a Y-direction. Accordingly, as the first member 1120 is expanded in the Y-direction at the high temperature, the pin 1100 provided to the upper surface of the first member 1120 moves up. Thereafter, when a peripheral temperature of the first member 1120 and the second member 1130 is lowered, the first member 1120 is contracted and accordingly, the pin 110 moves down to an original position.

In one example, a volume of each of the first member 1120 and the second member 1130 is determined according to the difference in the amount of thermal deformation between the support plate 210 and the insulating plate 250. Further, the difference in the amount of thermal deformation between the first member 1120 and the second member 1130 is determined according to the difference in the amount of thermal deformation between the support plate 210 and the insulating plate 250. For example, the bimetal member 1000 compensates for the amount of deformation by which the shape of the support unit 200 is deformed according to the difference in the amount of thermal deformation between the support plate 210 and the insulating plate 250. Hereinafter, the bimetal member 1000 will be described in more detail with reference to FIGS. 7 and 8.

Figure 7:
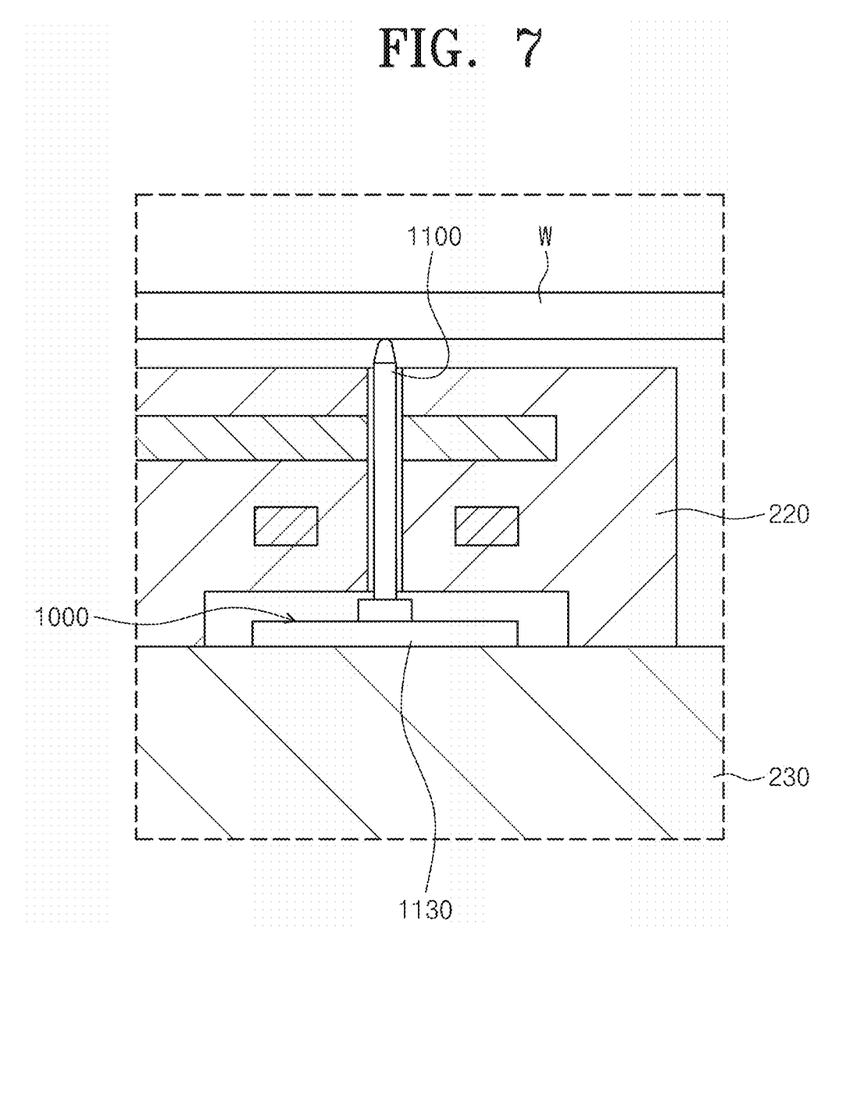
FIG. 7 is a diagram illustrating a state before thermal deformation of the support unit according to the exemplary embodiment of the present invention.
Figure 8:
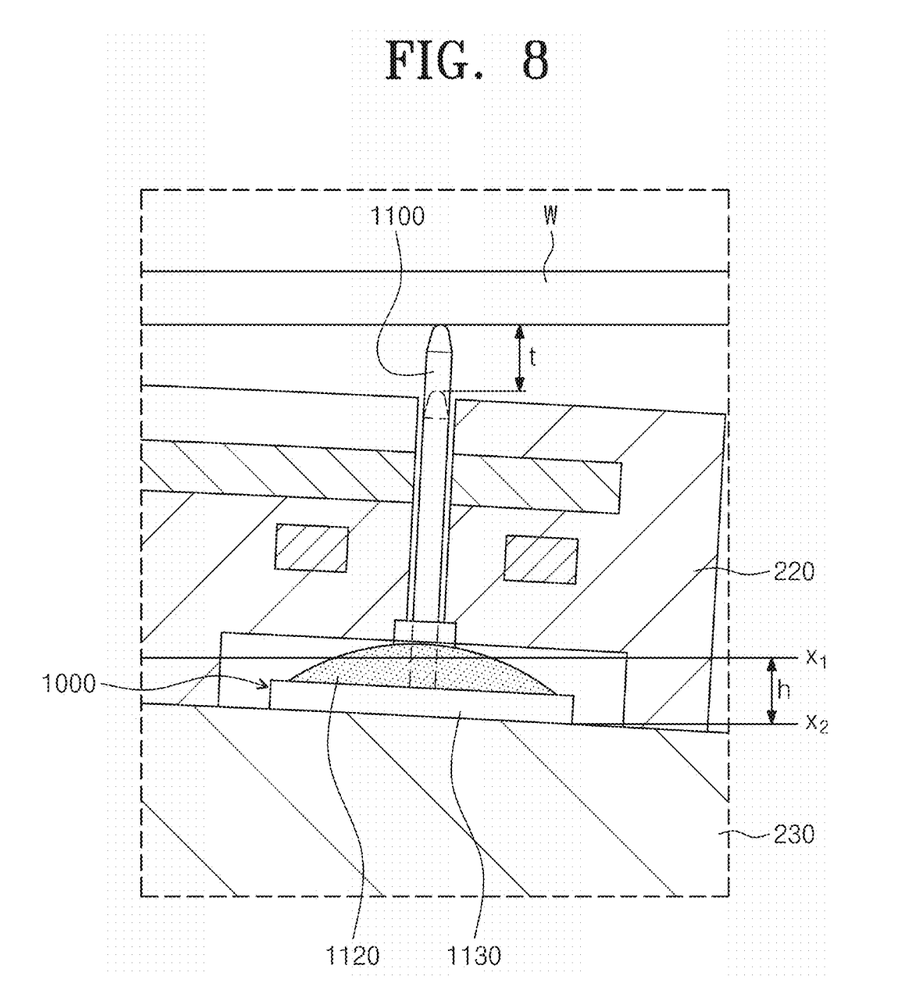
FIG. 8 is a diagram illustrating a state after thermal deformation of the support unit according to the exemplary embodiment of the present invention.

FIG. 7 is a diagram illustrating a state before thermal deformation of the support unit 200 according to the exemplary embodiment of the present invention, and FIG. 8 is a diagram illustrating a state after thermal deformation of the support unit 200 according to the exemplary embodiment of the present invention. Referring to FIG. 7, before the support unit 200 is thermally deformed, the support unit 200 and the substrate are in the flat state. Thereafter, when the support unit 200 is heated by the heater, the shape of the support unit 200 is deformed so that the center region of the support unit 200 is convex compared to the edge region. According to a flatness value of the support unit 200 in the flat state illustrated in FIG. 7 and a difference in a height ($|x1-x2|=h$) in the same region according to the convex shape of the support unit 200 illustrated in FIG. 8, the volume, the material, or the like of the first member 1120 and the second member 1130 of the bimetal member 1000 may be determined so that the height change t of the pin 1100 provided to the bimetal member 1000 can compensate for the height difference. For example, the volume, the material, or the like of the first member 1120 and the second member 1130 of the bimetal member 1000 may be determined so that h and t are the same.

In the foregoing example, it has been described that the dielectric plate 220, the lower plate 230, and the insulating plate 250 are provided in the support unit 200, and the bimetal member 1000 is provided within the dielectric plate 220. However, contrary to this, the bimetal member 1000 may be provided with the support unit 200 in which two plates made of different materials are combined. For example, the support unit 200 may include a first plate on which the substrate is placed, and a second plate made of a different material from that of the first plate and provided under the first plate. Further, the bimetal member 1000 may be provided within the first plate.

In the foregoing example, it is described that the bimetal member 1000 is provided in a circular shape. However, contrary to this, according to the shape of the support unit 200 or the shape of the deformation of the support unit 200 by a high temperature, the bimetal member 1000 may have a different shape, such as a triangle and a quadrangle.

According to the present invention, there is an advantage in that even though the member supporting the substrate is thermally deformed, the substrate may be seated flat on the support unit 200.

The foregoing exemplary embodiments are presented for helping the understanding of the present invention, and do not limit the scope of the present invention, and it should be understood that various modified exemplary embodiments from the foregoing exemplary embodiments are also included in the scope of the present invention. The technical protection scope of the present invention should be determined by the technical spirit of the claims, and it should be understood that the technical protection scope of the present invention is not limited to the literal description of the claims itself, but is substantially equivalent to the technical value.

What is claimed is:

1. A support unit for supporting a substrate, the support unit comprising:
   a support plate configured to support a substrate, and which includes an electrostatic electrode providing electrostatic force to the substrate;

a heater provided inside the support plate and configured to heat the substrate;
an insulating plate provided under the support plate as an insulating substance; and
a bimetal member disposed inside the support plate and configured to compensate for bending of the support plate due to heat,
wherein the bimetal member includes,
a pin provided to be contactable with a bottom surface of the substrate that is placed on the support plate;
a circular shaped first member configured to support the pin, the pin coupled to an upper surface of the circular shaped first member; and
a ring shaped second member provided to surround the circular shaped first member, and
the pin is provided to move up or move down according to a difference in the amount of thermal deformation between the circular shaped first member and the ring-shaped second member,
wherein a movement direction of the pin according to the difference in the amount of thermal deformation between the circular shaped first member and the ring-shaped second member is a direction opposite to a direction in which the support plate is bent according to a difference in the amount of thermal deformation between the support plate and the insulating plate in a region in which the bimetal member is provided.

2. The support unit of claim 1, wherein a thermal deformation rate of the circular shaped first member is different from a thermal deformation rate of the ring-shaped second member.

3. The support unit of claim 2, wherein the thermal deformation rate of the circular shaped first member is larger than the thermal deformation rate of the ring-shaped second member.

4. The support unit of claim 1, wherein a volume of each of the circular shaped first member and the ring-shaped second member is determined according to a difference in the amount of thermal deformation between the support plate and the insulating plate.

5. The support unit of claim 1, wherein the difference in the amount of thermal deformation between the circular shaped first member and the ring-shaped second member is determined according to a difference in the amount of thermal deformation between the support plate and the insulating plate.

6. The support unit of claim 1, wherein a plurality of bimetal members is provided, and
each of the bimetal members is disposed in a hollow hole formed inside the support plate.

7. The support unit of claim 6, wherein the support plate includes:
a dielectric plate configured to support the substrate, and which includes the electrostatic electrode therein and is provided as a dielectric substance; and
a lower plate disposed under the dielectric plate and provided with a cooling flow path therein, and
the bimetal member is disposed in the hollow hole formed inside the dielectric plate.

8. A support unit for supporting a substrate, the support unit comprising:
a first plate configured to support the substrate;
a heater provided inside the first plate and configured to heat the substrate;
a second plate provided under the first plate, the second plate comprising a different material than a material of the first plate; and
a bimetal member disposed inside the first plate and configured to compensate for bending of the first plate,
wherein the bimetal member includes,
a pin provided to be contactable with a bottom surface of the substrate that is placed on the first plate;
a circular shaped first member configured to support the pin, the pin coupled to an upper surface of the circular shaped first member; and
a ring-shaped second member provided to surround the circular shaped first member, and
the pin is provided to move up or move down according to a difference in the amount of thermal deformation between the circular shaped first member and the ring-shaped second member,
wherein a movement direction of the pin according to the difference in the amount of thermal deformation between the circular shaped first member and the ring-shaped second member is a direction opposite to a direction in which the first plate is bent according to a difference in the amount of thermal deformation between the first plate and the second plate in a region in which the bimetal member is provided.

9. The support unit of claim 8, wherein a thermal deformation rate of the circular shaped first member is different from a thermal deformation rate of the ring-shaped second member.

10. The support unit of claim 9, wherein the thermal deformation rate of the circular shaped first member is larger than the thermal deformation rate of the ring-shaped second member.

11. The support unit of claim 8, wherein a volume of each of the circular shaped first member and the ring-shaped second member is determined according to a difference in the amount of thermal deformation between the first plate and the second plate.

12. The support unit of claim 8, wherein the difference in the amount of thermal deformation between the circular shaped first member and the ring-shaped second member is determined according to a difference in the amount of thermal deformation between the first plate and the second plate.

13. The support unit of claim 8, wherein the amount of thermal deformation of the first plate is larger than the amount of thermal deformation of the second plate.

14. The support unit of claim 8, wherein the first plate includes a dielectric substance, and the second plate includes an insulating substance.

15. A substrate treating apparatus, comprising:
a dielectric plate configured to support a substrate, and which includes an electrostatic electrode therein and is provided as a dielectric substance;
a lower plate disposed under the dielectric plate and provided with a cooling flow path therein;
a heater provided inside the dielectric plate and configured to heat the substrate;
an insulating plate provided under the lower plate as an insulating substance; and
a bimetal member disposed inside the dielectric plate and configured to compensate for bending of the dielectric plate due to heat,
wherein the bimetal member includes,
a pin provided to be contactable with a bottom surface of the substrate that is placed on the dielectric plate;
a circular shaped first member configured to support the pin, the pin coupled to an upper surface of the circular shaped first member; and a ring shaped second member provided to surround the circular shaped first member, and the pin is provided to move up or move down according to a difference in the amount of thermal deformation between the circular shaped first member and the ring-shaped second member, wherein a movement direction of the pin according to the difference in the amount of thermal deformation between the circular shaped first member and the ring-shaped second member is a direction opposite to a direction in which the dielectric plate is bent according to a difference in the amount of thermal deformation between the dielectric plate, the lower plate, and the insulating plate in a region in which the bimetal member is provided.

16. The substrate treating apparatus of claim 15, wherein the amount of thermal deformation of the circular shaped first member is larger than the amount of thermal deformation of the ring-shaped second member.

17. The substrate treating apparatus of claim 15, wherein the difference in the amount of thermal deformation between the circular shaped first member and the ring-shaped second member is determined according to a difference in the amount of thermal deformation between the dielectric plate, the lower plate, and the insulating plate.

* * * * *